US008281978B2

(12) United States Patent
Ikeda et al.

(10) Patent No.: US 8,281,978 B2
(45) Date of Patent: Oct. 9, 2012

(54) ELECTRONIC APPARATUS PRODUCED USING LEAD-FREE BONDING MATERIAL FOR SOLDERING

(75) Inventors: Hiroki Ikeda, Himeji (JP); Katsu Yanagimoto, Himeji (JP)

(73) Assignee: Sanyo Special Steel Co., Ltd., Himeji-shi, Hyogo (JP)

( * ) Notice: Subject to any disclaimer, the term of this patent is extended or adjusted under 35 U.S.C. 154(b) by 159 days.

(21) Appl. No.: 12/744,540

(22) PCT Filed: Dec. 20, 2007

(86) PCT No.: PCT/JP2007/074558
§ 371 (c)(1),
(2), (4) Date: May 25, 2010

(87) PCT Pub. No.: WO2009/072221
PCT Pub. Date: Jun. 11, 2009

(65) Prior Publication Data
US 2010/0246148 A1    Sep. 30, 2010

(30) Foreign Application Priority Data
Dec. 7, 2007  (JP) .................................. 2007-317175

(51) Int. Cl.
*B23K 31/02* (2006.01)
(52) U.S. Cl. .................................. 228/180.1; 228/233.2
(58) Field of Classification Search .................... None
See application file for complete search history.

(56) References Cited

U.S. PATENT DOCUMENTS

| | | | | |
|---|---|---|---|---|
| 4,150,983 A * | 4/1979 | Mori | .............................. | 420/559 |
| 4,622,205 A * | 11/1986 | Fouts et al. | .................... | 420/566 |
| 5,328,521 A * | 7/1994 | Keusseyan | ....................... | 148/22 |
| 5,520,752 A * | 5/1996 | Lucey et al. | ................... | 148/400 |
| 5,730,932 A * | 3/1998 | Sarkhel et al. | ................ | 420/562 |
| 6,010,060 A * | 1/2000 | Sarkhel et al. | ............. | 228/179.1 |
| 6,077,477 A * | 6/2000 | Sakai et al. | ..................... | 420/560 |
| 6,231,691 B1 * | 5/2001 | Anderson et al. | ............. | 148/400 |
| 6,267,823 B1 * | 7/2001 | Yamaguchi et al. | ............ | 148/24 |
| 6,296,722 B1 * | 10/2001 | Nishimura | ..................... | 148/400 |
| 6,325,279 B1 * | 12/2001 | Sakai et al. | ................ | 228/233.2 |
| 6,428,745 B2 * | 8/2002 | Yamaguchi et al. | .......... | 420/562 |
| 6,457,233 B1 * | 10/2002 | Shimizu | .......................... | 29/840 |
| 6,602,777 B1 * | 8/2003 | Kao et al. | ...................... | 438/613 |

(Continued)

FOREIGN PATENT DOCUMENTS
JP   03-128192 A   5/1991
(Continued)

*Primary Examiner* — Kiley Stoner
(74) *Attorney, Agent, or Firm* — The Webb Law Firm

(57) ABSTRACT

Disclosed herein is an electronic apparatus produced using a high-temperature lead-free solder alloy which makes it possible to form soldered joints having no variations in strength and which has an excellent balance between strength and solderability. The lead-free solder alloy is an alloy which is made of an element A and an element B and which has a composition composed of AmBn being a stable phase and the element B in an equilibrium state at room temperature. When the lead-free solder alloy is solidified by quenching, the element A is dissolved in a room-temperature stable phase of the element B so that a supersaturated solid solution is formed, and when melted for soldering and then solidified, the alloy returns to its equilibrium state and has a composition composed of the stable phase AmBn and the element B and therefore maintains strength due to the presence of the stable phase AmBn even when reheated to a soldering temperature.

9 Claims, 2 Drawing Sheets

U.S. PATENT DOCUMENTS

| | | | |
|---|---|---|---|
| 6,767,411 B2 * | 7/2004 | Yeh et al. | 148/24 |
| 6,774,490 B2 * | 8/2004 | Soga et al. | 257/772 |
| 6,805,974 B2 * | 10/2004 | Choi et al. | 428/646 |
| 6,819,002 B2 * | 11/2004 | Chen et al. | 257/779 |
| 6,872,465 B2 * | 3/2005 | Soga et al. | 428/570 |
| 6,892,925 B2 * | 5/2005 | Interrante et al. | 228/56.3 |
| 6,930,389 B2 * | 8/2005 | Huang | 257/737 |
| 7,722,962 B2 * | 5/2010 | Soga et al. | 428/620 |
| 2003/0155402 A1 * | 8/2003 | Yeh et al. | 228/56.1 |
| 2004/0050904 A1 * | 3/2004 | Interrante et al. | 228/56.3 |
| 2004/0112478 A1 * | 6/2004 | Bieler et al. | 148/538 |
| 2005/0199679 A1 * | 9/2005 | Nakahara et al. | 228/56.3 |
| 2007/0245852 A1 | 10/2007 | Takaoka et al. | |
| 2009/0301607 A1 | 12/2009 | Nakano et al. | |
| 2010/0089498 A1 * | 4/2010 | Ikeda et al. | 148/22 |
| 2010/0246148 A1 * | 9/2010 | Ikeda et al. | 361/760 |

FOREIGN PATENT DOCUMENTS

| | | |
|---|---|---|
| JP | 2001-267715 A | 9/2001 |
| JP | 2005-251889 A | 9/2005 |
| WO | 2006/075459 A1 | 7/2006 |
| WO | 2007/055308 A1 | 5/2007 |

* cited by examiner

ELECTRONIC APPARATUS PRODUCED USING LEAD-FREE BONDING MATERIAL FOR SOLDERING

TECHNICAL FIELD

The present invention relates to an electronic apparatus produced using a lead-free bonding material for soldering.

BACKGROUND ART

In recent years, electronic apparatuses have become smaller and smaller in size, and therefore there has been a demand for higher-density electronic circuit boards for electronic apparatuses on which semiconductor devices or electronic devices are mounted. In order to satisfy such a demand, electronic circuit boards have been improved by, for example, reducing the pitch of wires to be soldered thereto. Meanwhile, from the viewpoint of environmental issues, there has been a demand for Pb-free solders that comply with, for example, the RoHS directive, and Sn—Ag—Cu-based eutectic alloys have already been practically used as solders for reflow soldering. On the other hand, as a high-temperature solder, Au-20Sn (melting point: 280° C.) is known and is hardly used because it is inferior to Pb—Sn-based solders in cost and mechanical properties. Therefore, other alloy systems which can be practically used as high-temperature solders have not yet been developed. Under the circumstances, high-temperature Pb solders are not yet included within the scope of the EU RoHS directive that restricts the use of hazardous substances such as Pb in electronic apparatuses and the like.

Further, in recent years, power ICs have been rapidly developed and have come to be practically used and the power capacity of power ICs has been increased steadily, and therefore various technologies to meet the demand for power ICs that can withstand high voltage and big current have been developed. Power ICs developed by new technologies are used under much higher voltage and current, and electricity conditions as compared to conventional power ICs, and are therefore often exposed to a current exceeding their rated current or a voltage exceeding their rated voltage transiently. This causes the problem of heat generation, which becomes increasingly prominent as output power increases. On the other hand, in order to ensure reliability for connection even under high power output conditions, there has been a demand for lead-free solders having a melting point higher than that of a conventional lead-free solder (e.g., Sn-3Ag-0.5Cu having a melting point of about 219° C.). However, high-temperature Pb-free solders suitable for practical use have not yet been developed. In addition, high-temperature Pb-free solders have a problem in that devices are degraded due to high soldering temperature and therefore their lifetimes are shortened.

Various soldering techniques effective for producing higher-density electronic apparatuses have been developed. For example, Patent Documents 1 and 2 disclose techniques for achieving higher-density packaging of electronic parts by reducing the pitch of wires and stacking a plurality of circuit boards.

[Patent Document 1] Japanese Patent Application Laid-Open No. 2005-251889

[Patent Document 2] Japanese Patent Application Laid-Open No. 2001-267715

DISCLOSURE OF THE INVENTION

As described above, these conventional techniques are both intended to achieve higher-density packaging of electronic parts by reducing the pitch of wires and stacking a plurality of circuit boards. However, means for soldering required to carry out such techniques for achieving higher-density packaging of electronic parts by reducing the pitch of wires and stacking a plurality of circuit boards, especially techniques for continuously performing soldering on portions very close to each other have not been disclosed. In order to produce such a multilayer circuit board as described above using fine-pitch wiring technology, it is very important to develop a means for soldering enabling continuous soldering to be performed without exerting any temperature influence on previously soldered joints.

In order to solve the above-described problem, an object of the present invention is to provide an electronic apparatus whose soldered joints are prevented from being degraded by the influence of temperature and maintain good joint strength even when soldering is continuously performed in two or more production processes.

The object of the present invention will be described in more detail based on a Sn—Cu-based solder alloy as one example of a high-temperature lead-free solder alloy according to the present invention. A Sn—Cu-based alloy is quenched to produce an alloy mainly composed of a Sn solid solution phase formed by forcibly dissolving Cu in Sn. The Sn solid solution phase is melted at around 230° C., and is then separated into two stable phases, a Sn—Cu phase and a Sn phase, by solidifying the alloy after soldering. The Sn—Cu phase has a high melting point, and therefore plays a role in maintaining of the strength of previously soldered joints during reflow soldering. It is therefore an object of the present invention to provide an electronic apparatus produced using a high-temperature lead-free solder alloy which makes it possible to form soldered joints having no variations in strength and which has an excellent balance between strength and solderability.

In order to achieve the above object, the present invention is directed to an electronic apparatus produced using a lead-free bonding material for soldering, wherein the lead-free bonding material is an alloy which is made of an element A and an element B and which has a composition composed of AmBn being a stable phase and the element B in an equilibrium state at room temperature, and wherein when the alloy is solidified by quenching, the element A is dissolved in a room-temperature stable phase of the element B so that a supersaturated solid solution is formed, and when melted for soldering and then solidified, the alloy returns to its equilibrium state and has a composition composed of the stable phase AmBn and the element B and therefore maintains strength due to the presence of the stable phase AmBn even when reheated to a soldering temperature. It is to be noted that m and n are numerical values inherent to an alloy system.

It is to be noted that in the present invention, the phrase "m and n are numerical values inherent to an alloy system" means that m and n are numerical values representing the ratio between the element A and the element B kept constant in a temperature range from a melting point or a temperature near the melting point to room temperature in the phase diagram of the alloy system. For example, in the case of a $Cu_6Sn_5$ intermetallic compound being a room-temperature stable phase of a Sn—Cu-based solder alloy, the element A is Cu, the element B is Sn, m is 6, and n is 5. The combinations of values themselves of m and n which are "numerical values inherent to an alloy system" can be determined from the phase diagram of the alloy system.

In the present invention, it is preferred that the element A is at least one selected from the group consisting of Cu, Mn, and Ni and the element B is at least one selected from the group consisting of Sn, In, and Bi.

In the present invention, it is also preferred that the stable phase $A_mB_n$ has a melting point higher than that of the element B by 150° C. or more.

Further, the electronic apparatus according to the present invention may include a circuit board to which a plurality of devices are soldered or a multilayer circuit board formed by soldering three or more circuit boards together.

The present invention is also directed to a method for producing an electronic apparatus, including the step of continuously soldering parts of an electronic apparatus with a lead-free bonding material, wherein the lead-free bonding material is an alloy which is made of an element A and an element B and which has a composition composed of $A_mB_n$ being a stable phase and the element B in an equilibrium state at room temperature, and wherein when the alloy is solidified by quenching, the element A is dissolved in a room-temperature stable phase of the element B so that a supersaturated solid solution is formed, and when melted for soldering and then solidified, the alloy returns to its equilibrium state and has a composition composed of the stable phase $A_mB_n$ and the element B and therefore maintains strength due to the presence of the stable phase $A_mB_n$ even when reheated to a soldering temperature.

As described above, the use of the alloy according to the present makes it possible to continuously perform soldering without exerting any temperature influence on previously soldered joints. This makes it possible to continuously perform soldering to solder a plurality of devices to a substrate or to continuously perform soldering to form a multilayer circuit board having three or more layers even when second, third, and higher-order layers are very close to each other.

Particularly, the present invention is appropriately applied to electronic apparatuses requiring continuous soldering performed on portions close to each other, and is therefore very useful in industrial fields.

BEST MODE FOR CARRYING OUT THE INVENTION

Figure 1:
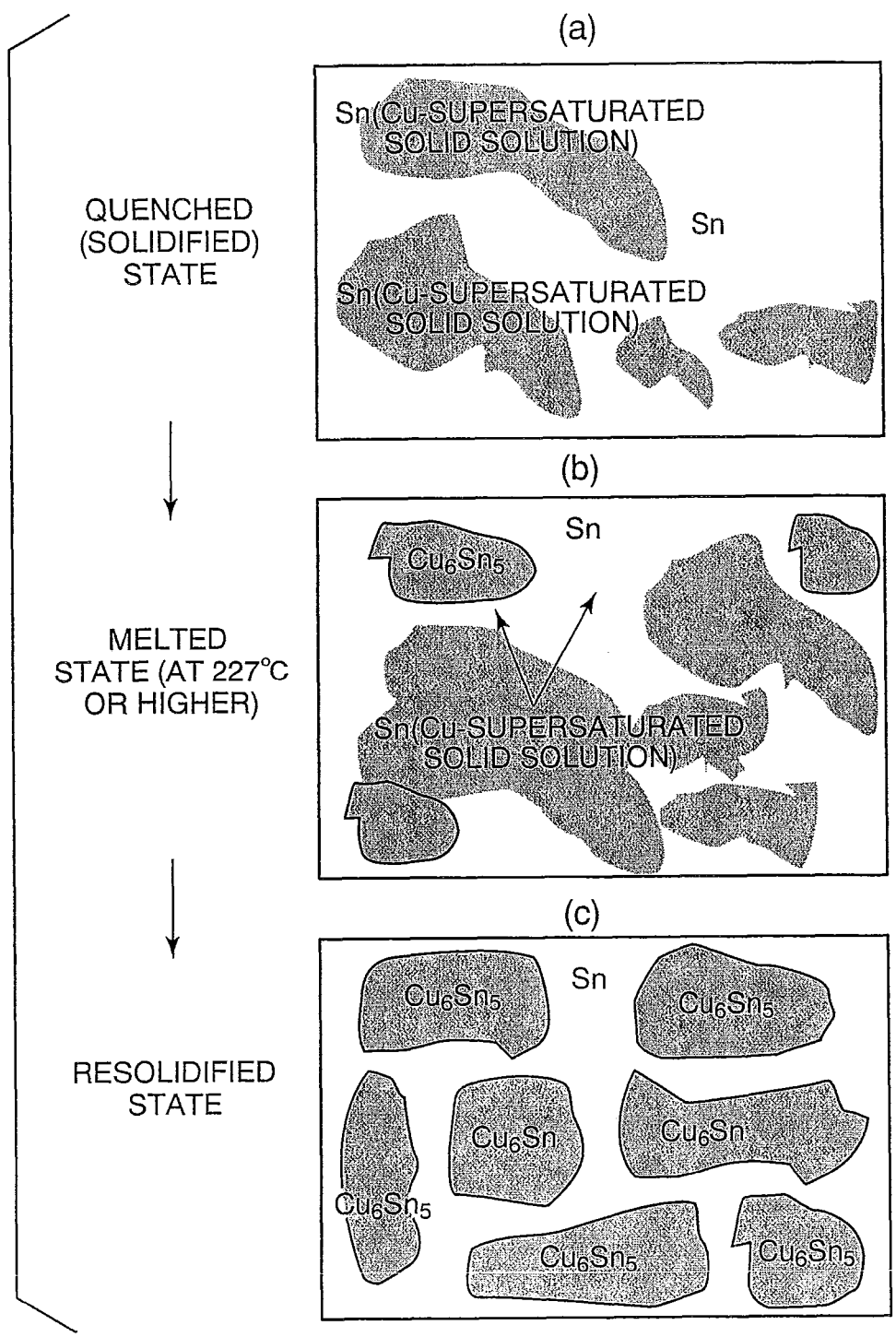
FIG. 1 is an illustration showing the behavior of a Sn—Cu alloy according to the present invention produced by quenching at the time when the Sn—Cu alloy is heated.

Hereafter, the present invention will be described in detail based on preferred embodiments.

An element A or B according to the present invention is not particularly limited, but preferred examples of the element A include Cu, Mn, and Ni and preferred examples of the element B include Sn, In, and Bi. Therefore, the element A and the element B preferably form an alloy such as a Cu—Sn-based alloy, a Mn—Sn-based alloy, a Ni—In-based alloy, a Mn—In-based alloy, or a Ni—Bi-based alloy.

Here, a circuit formed using a Sn—Cu-based solder alloy will be described in detail as one preferred embodiment according to the present invention.

The present inventors have first focused attention on the fact that a Sn solid solution, which cannot be found in the phase diagram of the Sn—Cu-based solder alloy, can be produced by a quenching process. The present inventors have unexpectedly found that when the alloy is produced by the quenching process such as an atomization method or a melt-spun method, Cu which should form a $Cu_6Sn_5$ intermetallic compound is forcibly dissolved in Sn, and as a result, a phase similar to a Sn phase, that is, a Sn solid solution phase is formed, and therefore the amount of the $Cu_6Sn_5$ intermetallic compound contained as a high-melting-point phase in the quenched alloy is significantly smaller than the theoretical amount of the $Cu_6Sn_5$ intermetallic compound calculated based on the ratio between Sn and Cu contained in the alloy. On the other hand, it has also been found that the amount of a Sn phase that contributes to soldering is significantly larger than the theoretical amount of the Sn phase because the Sn phase is present as a Sn solid solution phase.

Based on the findings, the present inventors have further found that the above-described alloy produced by the quenching process is mainly composed of a Sn solid solution phase and that a solid-state alloy different from that formed by the quenching process can be formed by melting the alloy mainly composed of a Sn solid solution phase for use as a solder material and then normally cooling the melted alloy.

Therefore, the use of such an alloy mainly composed of a Sn solid solution phase as a solder material makes it possible to perform soldering at a relatively low temperature (about 230° C.), and the resolidified solder remains in a good solid state even at high temperature (about 400° C. or higher) due to the presence of a $Cu_6Sn_5$ phase.

As described above, when soldering is performed using such an alloy material as described above, the alloy material is melted at about 230° C. because a Sn solid solution phase is present in large amounts. This makes it possible to achieve good soldering as in the case of soldering using a conventional Pb solder. Further, the melted alloy material is not quenched but cooled normally after soldering, and therefore a high-melting-point phase ($Cu_6Sn_5$ intermetallic compound) is formed in a theoretical amount calculated based on the ratio between Sn and Cu contained in the alloy.

The above-described $Cu_6Sn_5$ intermetallic compound has a melting point of 415° C. and is therefore not melted at a reflow soldering temperature of 250° C. or lower, and previously soldered joints maintain sufficient strength during reflow soldering. Further, this compound phase has a very fine uniform structure because it is formed by completely melting the alloy material having a substantially uniform structure formed by quenching and then solidifying the melted alloy material in accordance with the phase diagram. The Sn—Cu-based alloy is different from a conventional solder alloy having a structure formed by liquid- and solid-phase diffusion, and therefore the compound is produced at a high speed. Further, the Sn—Cu-based alloy is advantageous in that it can form soldered joints having no variations in strength because of the absence of remaining Cu.

Further, in the case of the Sn—Cu-based alloy, the optimum Cu content of the alloy is 14 to 45%. This is because the optimum balance between the amount of a Sn solid solution that contributes to soldering and the amount of a $Cu_6Sn_5$ intermetallic compound that contributes to maintaining of the strength of soldered joints can be achieved. The present inventors have intensively studied the Cu content of the Sn—Cu-based alloy. As a result, it has been found that the upper limit of the Cu content of the alloy is preferably 45 atomic % because if the Cu content of the alloy exceeds 45 atomic %, the amount of a $Cu_6Sn_5$ intermetallic compound produced is significantly increased so that the amount of a Sn solid solution that contributes to soldering is reduced even when the quenching process is employed, and therefore it becomes difficult to achieve good soldering. On the other hand, if the Cu content of the alloy is less than 14 atomic %, it becomes difficult to produce a sufficient amount of $Cu_6Sn_5$ intermetallic compound that contributes to maintaining the strength of soldered joints. Therefore, the Cu content of the alloy is preferably in the range of 14 to 45 atomic %, more preferably in the range of 25 to 45 atomic %.

This property holds true also with a case where the element A is changed to Mn while the element B remains Sn. In the case of a Sn—Mn-based solder alloy, $MnSn_2$ is produced as a high-melting-point intermetallic compound. In this case, the Mn content of the alloy is set to a value in the range of 15 to 35 atomic % and Mn is dissolved in Sn by the quenching process to form a supersaturated solid solution. This makes it possible to achieve good solderability and good balance between a precipitated Sn phase and a precipitated $MnSn_2$ phase that contributes to maintaining of the strength of soldered joints, thereby allowing the soldered joints to maintain joint strength even when the soldered joints are reheated to a temperature similar to a soldering temperature.

Even when the element B is, for example, Bi having a melting point higher than that of Sn (232° C.) or In having a melting point lower than that of Sn, as described above, a bonding material, which is required to maintain its joint strength even when reheated to a temperature similar to a soldering temperature after brazing performed at a temperature higher than a general soldering temperature or after bonding performed at a temperature lower than a general soldering temperature, can be obtained by changing the element A depending on the kind of element B according to the findings similar to the above description.

For example, in a case where the element B is Bi having a melting point of 271° C., Ni can be used as the element A, and in a case where the element B is In having a melting point of 156° C., Ni or Mn can be used as the element A. It is to be noted that bondability is dependent on the melting point of the bonding material, and therefore in view of this, the melting point of the element B is preferably 810° C. or lower.

Further, in the case of an In—Ni-based alloy, the Ni content of the alloy is desirably 5 to 29 atomic % in order to utilize an In27Ni10 intermetallic compound. In the case of an In—Mn-based alloy, the Mn content of the alloy is desirably 8 to 50 atomic % in order to utilize an InMN3 intermetallic compound. In the case of a Bi—Ni-based alloy, the Ni content of the alloy is desirably 5 to 25 atomic % in order to utilize a Bi3Ni intermetallic compound.

The present invention will be described in more detail based on a Sn—Cu-based solder alloy as one embodiment according to the present invention.

The Sn—Cu-based solder alloy is a Sn-(14-45%)Cu alloy produced by a quenching method such as an atomization method, a melt-spun method, or a water spinning method. When the Sn-(14-45%)Cu alloy having a composition range specified in the present invention is not produced by quenching, a Sn phase and a $Cu_6Sn_5$ intermetallic compound are present in a ratio determined from the phase diagram of the alloy. On the other hand, when the alloy is produced by quenching, a great deal of Cu is forcibly dissolved in a Sn phase so that a Sn solid solution is formed. The Sn solid solution is melted at around 230° C. that is substantially the same as a temperature at which a normal Sn phase is melted, and therefore contributes to good soldering.

Further, the difference in melting point between a high-melting-point layer and a low-melting-point layer formed by once melting the Sn—Cu-based solder alloy and then solidifying the melted Sn—Cu-based solder alloy should be 150° C. or more. The reason is as follows. When soldering is performed using a bonding material and a soldering iron or the like, the temperature of the tip of the soldering iron is higher than the melting point of the bonding material by about 100° C. Therefore, if the difference in the melting point between the high-melting-point phase and the low-melting-point phase is less than 150° C., previously soldered joints are affected by conductive heat during heating when portions to be soldered are close to the previously soldered joints, and at worst, there is a case where disconnection occurs at the previously soldered joints.

FIG. 1 is an illustration showing the behavior of the Sn—Cu alloy according to the present invention produced by quenching at the time when the Sn—Cu alloy is heated.

FIG. 1(a) shows the state of the Sn—Cu alloy solidified by quenching, FIG. 1(b) shows the state of the melted Sn—Cu alloy (at 230° C. or higher), and FIG. 1(c) shows the state of the resolidified Sn—Cu alloy. As shown in FIG. 1(a), in a case where the Sn-25Cu alloy is quenched, Cu is dissolved in Sn so that a supersaturated solid solution is formed, and therefore a meltable portion (Sn) which can be used as a solder is increased. Then, when the Sn—Cu alloy is melted for use as a solder, as shown in FIG. 1(b), a Sn(Cu-supersaturated) phase is melted and converted into Sn and CU6Sn5. Then, when the melted Sn—Cu alloy is resolidified, as shown in FIG. 1(c), a high-melting-point phase is increased but the meltable portion (Sn) is reduced and the Sn—Cu alloy is brought into a stable equilibrium state (Cu6Sn5: 62%, Cu3Sn: 15%).

Figure 2:
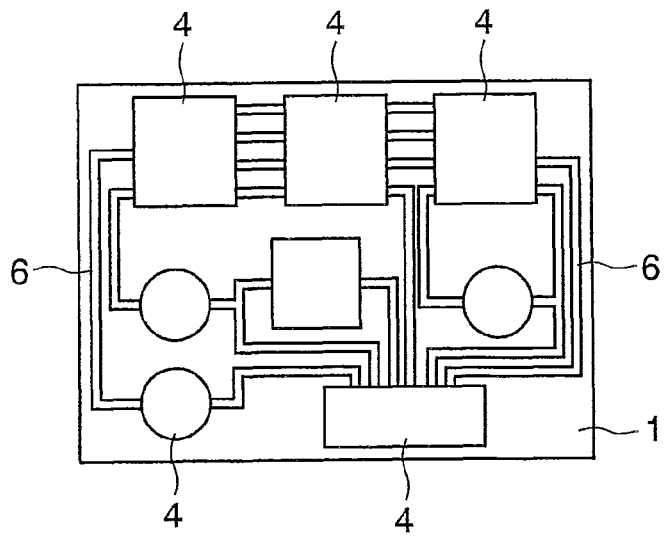
FIG. 2 is a schematic diagram of a circuit board to which a plurality of devices is soldered using the Sn—Cu alloy according to the present invention.

FIG. 2 is a diagram showing a circuit board to which a plurality of devices is soldered using the Sn—Cu alloy according to the present invention. As shown in FIG. 2, when devices 4 to be soldered to a substrate 1 by a solder alloy are too close to other devices previously soldered to the substrate 1, there is a problem that a solder fixing the other devices to the substrate 1 is melted by conductive heat when conductive wires extending from the devices 4 such as wires 6 and the substrate 1 are heated in order to solder the devices 4 to the substrate 1 so that the other devices previously soldered to the substrate 1 become unstable and, at worst, the other devices are disconnected from the substrate 1. However, the use of the Sn—Cu solder alloy according to the present invention produced by quenching solidification makes it possible to continuously perform soldering with stability without changing the composition of a solder alloy used. This is because a stable phase having a high melting point is present in the Sn—Cu solder alloy after the Sn—Cu solder alloy is melted for soldering and then solidified, and therefore even when devices previously soldered to a substrate, the substrate, and the Sn—Cu solder alloy fixing the soldered devices are heated in order to solder other devices to the substrate, the high-melting-point stable phase fixing the soldered devices is not remelted.

FIG. 3(a) is a schematic view of a multilayer circuit board formed by soldering three or more circuit boards together using a conventional solder material. FIG. 3(b) is a schematic view of a multilayer circuit board formed by soldering three or more circuit boards together using the Sn—Cu alloy according to the present invention produced by quenching. As shown in FIG. 3(a), in the case of a multilayer circuit board having, for example, three circuit boards, a solder alloy 5 having a melting point of 230° C.+(+(needs to be used to perform soldering on a circuit board 3 as a third layer in order to prevent the solder alloy on the circuit board 3 from being melted when soldering is performed on a circuit board 2 as a second layer and a circuit board 1 as a first layer. Further, when the circuit board 2 is soldered to the circuit board 3, a solder having a melting point of 230° C.+(needs to be used. Therefore, a general solder alloy can be used only when the circuit board 1 is soldered to the circuit board 2. As described above, in the case of a multilayer circuit board, it is necessary to change the melting temperature of a solder to be used per layer, and the melting temperature of a solder to be used is increased as the number of layers of the multilayer circuit board is increased, which causes a misalignment between layers, non-uniformity of layer thickness, and thermal degradation of devices 4 mounted on the lowermost circuit board.

Figure 3:
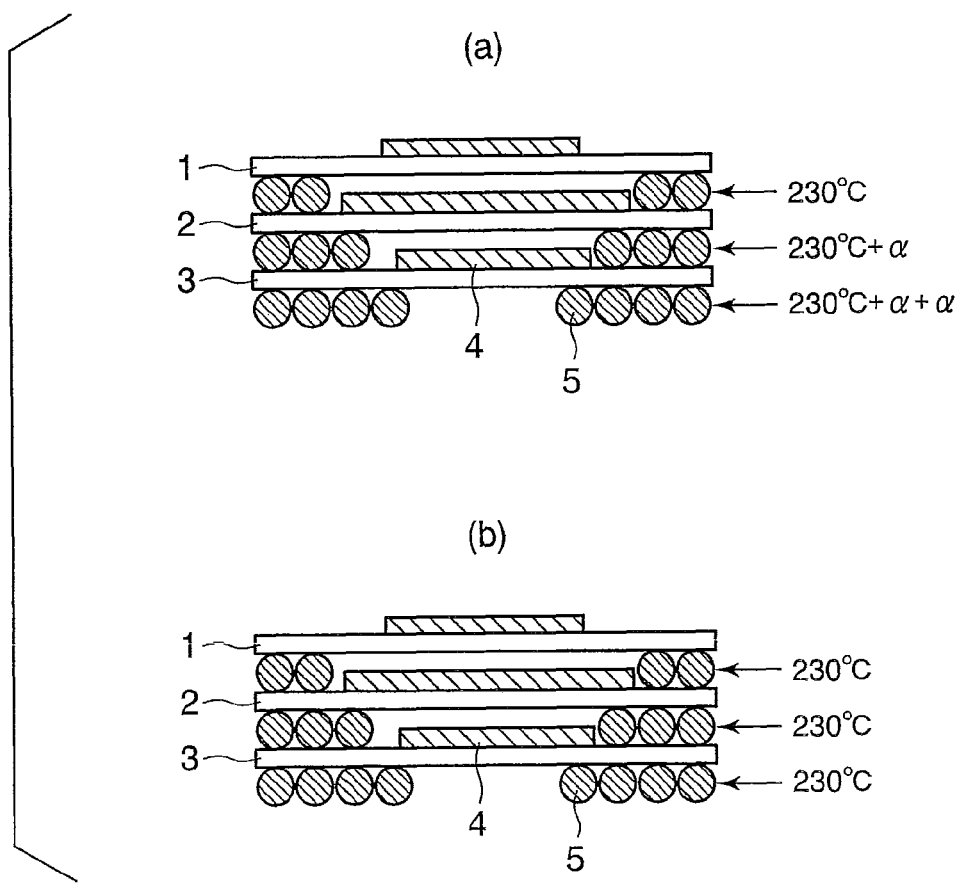
FIG. 3 is a schematic diagram of a multilayer circuit board formed by soldering three or more circuit boards together using the Sn—Cu alloy according to the present invention.

On the other hand, as shown in FIG. 3(*b*), the use of the Sn—Cu alloy according to the present invention produced by quenching makes it possible to continuously perform soldering with stability without changing the composition of a solder alloy used. The reason is as follows. A stable phase having a high melting point is present in the solidified Sn—Cu alloy according to the present invention, and therefore the strength of soldered joints can be maintained. More specifically, when the second layer is soldered to the third layer, the temperature to which the circuit boards 2 and 3 and the solder alloy 5 are heated is the same as that when the first layer is soldered to the second layer. Even when the circuit board 3 is heated to a soldering temperature to further stack a circuit board, the solder alloy 5 is not remelted. Therefore, unlike the case shown in FIG. 3(*a*), it is not necessary to add a temperature difference α per layer to be stacked to 230° C.

EXAMPLES

Hereinafter, the present invention will be described more specifically with reference to the following examples.

Table 1 shows the results of evaluation of solderability of a solder used for soldering three circuit boards together to form a multilayer circuit board shown in FIG. 3 and the results of evaluation of the effect of heat on devices (thermal degradation). The solderability and thermal degradation were evaluated in the following manner.

In a case where a Sn-based solder is used, a circuit board 2 as a second layer needs to be soldered to a circuit board 3 as a third layer by heating at, for example, 260° C. (230° C.+30° C. as a temperature difference required for stacking of three layers), a circuit board 1 as a first layer needs to be soldered to the circuit board 2 by heating at 245° C. (230° C.+15° C. as a temperature difference), and finally, devices on the circuit board 1 are soldered at 230° C. However, in this evaluation, all the circuit boards and devices were soldered by heating at 260° C. without temperature differences, and the thermal degradation was evaluated by the degree of a misalignment between the circuit board 2 and the circuit board 3 as second and third layers most affected by heat and the degree of non-uniformity of layer thickness.

In the case of an In alloy having a low melting point, soldering was performed by heating at 200° C. In the case of a Bi alloy having a high melting point, soldering was performed by heating at 300° C. The solderability was evaluated according to the following three criteria.

□: Good soldering was achieved without voids.
Δ: Soldering could be performed but voids were formed.
x: Soldering could not be performed.

After the completion of soldering, the devices on the circuit boards were observed to determine the presence or absence of a change, and the thermal degradation was evaluated according to the following four criteria.

□: No changes were observed.
Δ: Slight misalignment occurred.
x: Misalignment occurred and non-uniformity of layer thickness was observed.
-: Evaluation could not be performed because solder was not melted at heating temperature and therefore soldering could not be performed.

TABLE 1

| No | Type of Alloy System | Element Composition (atomic %) | Melting Point of Stable High-Melting-Point Layer (° C.) | Temperature Applied on Three-Layered Circuit Board for Soldering (° C.) | Solderability | Influence State of Three-Layered Circuit Board | Notes |
|---|---|---|---|---|---|---|---|
| 1 | Cu—Sn | 15:85 | 415 | 260 | ○ | □ | Examples |
| 2 | Cu—Sn | 30:70 | 415 | 260 | ○ | □ | |
| 3 | Cu—Sn | 40:60 | 415 | 260 | ○ | □ | |
| 4 | Cu—Sn | 45:55 | 415 | 260 | ○ | □ | |
| 5 | Mn—Sn | 20:80 | 549 | 260 | ○ | □ | |
| 6 | Mn—Sn | 30:70 | 549 | 260 | ○ | □ | |
| 7 | Ni—In | 10:90 | 449 | 200 | ○ | □ | |
| 8 | Ni—In | 20:80 | 449 | 200 | ○ | □ | |
| 9 | Mn—In | 10:90 | 872 | 200 | ○ | □ | |
| 10 | Mn—In | 25:75 | 872 | 200 | ○ | □ | |
| 11 | Mn—In | 45:55 | 872 | 200 | ○ | □ | |
| 12 | Ni—Bi | 10:90 | 469 | 300 | ○ | □ | |
| 13 | Ni—Bi | 20:80 | 469 | 300 | ○ | □ | |
| 14 | Cu—Sn | 5:95 | 415 | 260 | ○ | Δ | Comparative |
| 15 | Cu—Sn | 60:40 | 415 | 260 | x | — | Examples |
| 16 | Mn—Sn | 5:95 | 549 | 260 | ○ | Δ | |
| 17 | Mn—Sn | 62:38 | 549 | 260 | x | — | |
| 18 | Ni—In | 2:98 | 449 | 200 | ○ | x | |
| 19 | Ni—In | 45:55 | 449 | 200 | x | — | |
| 20 | Mn—In | 4:96 | 872 | 200 | Δ | Δ | |
| 21 | Mn—In | 67:33 | 872 | 260 | x | — | |
| 22 | Ni—Bi | 2:98 | 469 | 300 | Δ | x | |
| 23 | Ni—Bi | 45:55 | 469 | 300 | x | — | |

TABLE 1-continued

| Type No | of Alloy System | Element Composition (atomic %) | Melting Point of Stable High-Melting-Point Layer (° C.) | Temperature Applied on Three-Layered Circuit Board for Soldering (° C.) | Solderability | Influence State of Three-Layered Circuit Board | Notes |
|---|---|---|---|---|---|---|---|
| 24 | Pb—Sn | 37:63 | Stable high-melting-point phase was not present. Melting Point of Alloy: 184° C. | 260 | ○ | x | |
| 25 | Pb—Sn | 90:10 | Stable high-melting-point phase was not present. Melting Point of Alloy: 305° C. | 260 | x | — | |
| 26 | Sn—3Ag—0.5Cu | | Stable high-melting-point phase was not present. Melting Point of Alloy: 219° C. | 260 | ○ | x | |

As shown in Table 1, Nos. 1 to 13 are Examples and Nos. 14 to 26 are Comparative Examples.

In the cases of the Comparative Examples 14 to 23, the element composition is not within the range specified in the present invention. In the cases of the Comparative Examples 14, 16, 18, 20, and 22, the element A can be dissolved in the element B by quenching solidification to form a supersaturated solid solution, but the amount of the solid solution itself is small and therefore the amount of a stable high-melting-point phase formed by melting and solidifying the alloy system is small, which makes it impossible to maintain the strength of soldered joints when the soldered joints are reheated to the soldering temperature. In the cases of the Comparative Examples 15, 17, 19, 21, and 23, the amount of the element A is too large, and therefore even when the element A is dissolved in the element B by quenching solidification process to form a supersaturated solid solution, the amount of the remaining element A is larger than the amount of the element A dissolved in the element B, which makes it impossible to achieve good soldering because the melting point itself of the alloy system is higher than the soldering temperature.

As described above, in all the cases of the Comparative Examples, previously soldered joints were affected by heat when soldering was performed to form a multilayer circuit board or soldering itself could not be performed. On the other hand, all the alloy systems of the Examples 1 to 13 satisfy the requirements of the present invention, and therefore it is possible to continuously perform soldering with stability to form a multilayer circuit board without any adverse effect on previously soldered joints.

The invention claimed is:

1. A method for producing an electronic apparatus, comprising the steps of:
providing a lead-free bonding material, the lead-free bonding material comprising an alloy comprising an element A and an element B, wherein element A is dissolved in a room-temperature stable phase of the element B so that a supersaturated, non-equilibrium solid solution is formed; and
soldering parts of the electronic apparatus at a soldering temperature with said lead-free bonding material, whereby the alloy is melted and then solidified, and whereby the alloy changes to its equilibrium state comprising AmBn being in a stable phase and element B being in a stable phase.

2. The method of claim 1, wherein element A is at least one selected from the group consisting of Cu, Mn, and Ni and element B is at least one selected from the group consisting of Sn, In, and Bi.

3. The method of claim 1, wherein the stable phase AmBn has a melting point higher than that of element B by 150° C. or more.

4. The method of any one of claims 1 to 3, wherein a plurality of devices are soldered to a circuit board, or a multilayer circuit board is formed by soldering three or more circuit boards together.

5. The method of claim 1, further comprising reheating the lead-free bonding material to the soldering temperature, wherein AmBn stable phase remains during the reheating.

6. An electronic apparatus comprising parts of the electronic apparatus soldered together with a lead-free bonding material, where the electronic apparatus is formed by the method of claim 1.

7. The electronic apparatus of claim 6, wherein element A is at least one selected from the group consisting of Cu, Mn, and Ni and element B is at least one selected from the group consisting of Sn, In, and Bi.

8. The lectronic apparatus of claim 6, wherein the stable phase AmBn has a melting point higher than that of element B by 150° C. or more.

9. The electronic apparatus of any one of claims 6 to 8, which comprises a circuit board to which a plurality of devices are soldered, or a multilayer circuit board formed by soldering three or more circuit boards together.

* * * * *